United States Patent [19]
Wada et al.

[11] Patent Number: 5,189,309
[45] Date of Patent: Feb. 23, 1993

[54] AVALANCHE PHOTODIODE WITH AlInAsP CAP LAYER

[75] Inventors: Morio Wada, Tokyo; Masahito Seko, Yamato; Youichi Sekiguchi, Tokyo; Hideto Iwaoka, Hachioji, all of Japan

[73] Assignee: Optical Measurement Technology Development Co., Ltd., Tokyo, Japan

[21] Appl. No.: 726,802

[22] Filed: Jul. 8, 1991

[30] Foreign Application Priority Data

Aug. 7, 1990 [JP] Japan .................. 2-209584

[51] Int. Cl.⁵ .......................... H01L 27/14
[52] U.S. Cl. .................. 257/21; 257/187; 257/438; 257/185
[58] Field of Search .......... 357/30 P, 30 E, 30 A, 357/30 B, 16, 4, 56, 55

[56] References Cited

U.S. PATENT DOCUMENTS

| | | | |
|---|---|---|---|
| 4,684,969 | 8/1987 | Taguchi | 357/30 A |
| 4,906,583 | 3/1990 | Kagawa et al. | 357/30 A X |
| 4,982,255 | 1/1991 | Tomita | 357/30 A |

FOREIGN PATENT DOCUMENTS

| | | | |
|---|---|---|---|
| 1-194476 | 8/1989 | Japan | 357/30 A |
| 1-259579 | 10/1989 | Japan | 357/30 E |
| 2107927 | 5/1983 | United Kingdom | 357/4 |

OTHER PUBLICATIONS

Trommer et al., "In$_{0.53}$Ga$_{0.47}$/InP Pin and Avalanche Photodiodes for the 1 μm to 1.6 μm Wavelength Range," *Siemens Forsch.-u. Entwickl.-Ber.*, vol 11 (1982), No. 4, pp. 216-220.

*Primary Examiner*—William Mintel
*Attorney, Agent, or Firm*—Cushman, Darby & Cushman

[57] ABSTRACT

A photodiode having a GaInAs light-absorbing layer on an InP substrate which can reduce temperature dependence of the spectral responsivity as well as enable the optical power measurement with less dependence on the incident light spectral width by using a material with smaller composition ratio of Ga for the light-absorbing layer to extend the absorption edge toward the longer wavelengths.

2 Claims, 11 Drawing Sheets

AVALANCHE PHOTODIODE WITH AlINASP CAP LAYER

FIELD OF THE INVENTION

This invention is applicable to photodiodes using a hetero junction of III-V semiconductor compound crystals. This invention relates more particularly to an improvement in spectral responsivity.

BACKGROUND OF THE INVENTION

When a ternary or quaternary alloy semiconductor is expressed in this specification, component elements of the semiconductor are described by a series of elements like [GaInAs]. The actual composition of such a semiconductor is expressed like [$Ga_xIn_{1-x}As$].

Most applications receiving light having a relatively long wavelength have used a photodiode made of materials such as germanium (Ge) and gallium indium arsenic phosphide (GaInAsP) other than special cases. $Ga_xIn_{1-x}As_yP_{1-y}$ (where x or y indicates composition) has been considered to be particularly preferable as the band gap energy thereof may be changed while the lattice constant thereof is matched with that of the InP crystal by selecting the composition properly. This makes it possible to epitaxially grow a light-absorbing layer having any desired spectral range for available sensitivity within the wavelength of about 1-1.7 μm on an InP substrate.

Such a light-absorbing layer of $Ga_xIn_{1-x}As_yP_{1-y}$ may be used as an avalanche photodiode by forming a pn junction within the light-absorbing layer, a pn junction between the layer and the substrate or a pn junction within the InP cap layer formed on the light-absorbing layer. It is also known to use such light-absorbing layer as a PIN photodiode by forming an InP cap layer thereon. Recently there has been manufactured a GaInAsP photodiode which has superior electrical characteristics to the Ge photodiode in such electric characteristics as dark current, frequency response, multiplication noise as well as the spectral responsivity in the wavelength longer than about 1.5 μm. Details are given in S. Sakai et al., Collection of papers of Telecommunications Association, Vol. J62-C, No.10, 1979/10.

Among $Ga_xIn_{1-x}As_yP_{1-y}$ crystals, those having x=0.47, y=1 or $Ga_{0.47}In_{0.53}As$ have the smallest band gap energy, 0.75 eV at room temperature, of all those having the lattice constant matched with that of InP. When such crystals are used as the light-absorbing layer, the photodiode will have a spectral responsivity of approximately 0.9-1.7 μm. The drop in the spectral responsivity in the range below 1 μm is attributable to light absorption by the InP cap layer provided on the incident side of the light absorbing layer. The drop at longer wavelengths is attributable to the fact that the absorption edge of the light-absorbing layer of $Ga_{0.47}In_{0.53}As$ is around 1.65 μm, and therefore light having wavelengths longer than that cannot be absorbed.

FIG. 1 shows an example of measurement of the spectral responsivity as a function of the wavelength for a conventional photodiode. As shown in (2): H. Yamagishi, Y. Suzuki and A. Hiraida, "Precise Measurement of Photodiode Spectral Responses Using the Calorimetric Method", IEEE Trans. Instrum. Meas. 38 (1989) 578, a commercial $Ga_{0.47}In_{0.53}As$/InP-PIN photodiode is measured at different temperatures of −15.9° C., −4° C., 19.9° C. and 39.7° C. The spectral responsivity is expressed in terms of the output electric current [A] per incident optical power [W], and the incident optical power was measured by a highly sensitive calorimeter.

The spectral responsivity such as above may be simulated at a considerably high precision by using the external quantum efficiency next=[spectral responsivity/absolute spectral responsivity] of the PIN photodiode structure obtained by experiment with consideration of the structure of the anti-reflection coating film against the incident light. The method of simulation is indicated in M. Wada, M. Seko, K. Sakakobara and Y. Sekiguchi, "GaInAs/InP PIN Photodiode Fabricated by MOVPE and a New Zn Diffusion Technique", Jpn. J. Appl. Phys. 29 (1990) L401. (herein Wada et al.) B. Wendland and P. Wendland, "Optical Power Measurement Errors Arising From Source Spectral Width", Primary Standard Symposium, NBS Boulder, Sept. 1986. (herein Wendland et al.) shows that the spectral responsivity of a photodiode relates to errors in optical power measurement.

However, in a photodiode having a light-absorbing layer of $Ga_{0.47}In_{0.53}As$, the spectral responsivity starts to deteriorate at a wavelength close to 1.55 μm, which is an extremely important wavelength in optical communications. This wavelength is needed for optical measurement and other applications as it is the wavelength of minimum propagation loss region of silica glass optical fibers as well as the emission wavelength of GaInAsP lasers. This entails the following problems:

(1) The spectral responsivity fluctuates widely due to changes in temperature at the wavelength longer than 1.5 μm.

(2) Optical power measurement errors are caused by the spectral width of the incident light.

The first problem of temperature dependence of spectral responsivity will be described below.

FIG. 2 shows temperature dependent changes in spectral responsivity. The change to the spectral responsivity $R_T(\ )$ [A/W] at the temperature of T° C. from the spectral responsivity $R_{20}(\ )$ [A/W] at 20° C. is expressed in percentage, as calculated in accordance with the equation below:

$$R = \frac{R_T(\ ) - R_{20}(\ )}{R_{20}(\ )} \times 100 \ [\%]$$

FIG. 2 shows that R increases remarkably from the wavelength of 1.5 μm in the vicinity of the absorption-edge wavelength of the $Ga_{0.47}In_{0.53}As$ light-absorbing layer. This is attributable to the temperature change $E_g/T[eV/K]$ of the energy gap Eg (the band gap at the point r or where k=0 in the band structure) for direct transition of $Ga_{0.47}In_{0.53}As$ and related to spectral responsivity characteristics such as the internal quantum efficiency and wavelength dependence of anti-reflection coating film.

In order to analyze the above fact further, a photodiode having a section as shown in FIG. 3 is assumed. The photodiode is a PIN photodiode of InP/GaInAs/InP hetero junction structure wherein an n+ type InP buffer layer 22, an n type GaInAs light-absorbing layer 23 and an n type InP cap layer 24 are epitaxially grown on an n+ type InP Substrate 21. An $SiO_2$ film 25 is provided around the light receiving area on the surface of the InP cap layer 24. A Zn-diffused region 26 is formed in the light receiving area to extend from the cap layer 24 to the light-absorbing layer 23. An Au-Zn/Au electrode 27 is formed on the surface of the Zn diffused region 26 while an Au-Sn/Au electrode 28 is provided on the rear surface of the substrate 21. The cap layer 24 which includes the Zn diffused region 26 is coated with an $Si_3N_4$ film 29 and an $SiO_2$ film 30 as an anti-reflection coating film.

The impurity concentration and thickness of each layer which will affect the spectral responsivity are determined as below:

| buffer layer 22 | $1-3 \times 10^{18}$ cm$^{-3}$; 0.3 μm |
|---|---|
| light-absorbing layer 23 | $1-2 \times 10^{15}$ cm$^{-3}$; 2.8 μm |
| $Si_3N_4$ film 29 | 0.117 μm |
| $SiO_2$ film 30 | 0.12 μm |

For simplification, it is assumed that no recombination of photo-generated carriers will occur on the surface of the cap layer 24 and the interface of InP/GaInAs, and the effect of multiple reflection of light on the cap layer 24 will be overlooked as the effect thereof is negligible in the vicinity of the wavelength of 1.5 μm.

In order to obtain the temperature dependent effect of the band gap energy, the band gap energy is calculated in accordance with the empirical formula of V. P Varshni:

$$E_g = E_o - (\alpha T^2)/(T+\beta) \quad [eV]$$

InP and GaInAs respectively have the values of $E_o$, $\alpha$ and $\beta$ as shown in the table below.

|  |  | InP | GaInAs |
|---|---|---|---|
| $E_0$ | [eV] | 1.412 | 0.814 |
| $\alpha(\times 10^{-4})$ | [eV/K] | −3.63 | −4.906 |
| $\beta$ | [K] | 162 | 301 |

Under the above assumed conditions, the spectral responsivity was calculated at the temperatures of −16° C., −4° C., 20° C. and 40° C. in accordance with the Wada et al. article (3). The results are indicated in FIGS. 5 and 6.

FIG. 4 shows the calculations of the reflectance of the anti-reflection film, FIG. 5 those of the spectral responsivity, and FIG. 6 the temperature dependent changes R of the spectral responsivity, respectively. FIG. 6 shows calculations of R in solid lines, and measurements given in FIG. 2 are plotted in dashed and dotted lines and broken lines.

Although there is slight deviation from the measured values, it can be seen that the temperature dependent changes R of the spectral responsivity can be described by the calculation method mentioned above. The slight deviation from the measured values may be attributable to the fact that the absorption-edge wavelength of GaInAs (band gap energy) taken from the reference material for the calculation was slightly too large or had a shorter wavelength.

FIG. 7 is a modification of FIG. 6 wherein the changes R in the spectral responsivity at the wavelengths of 1.3 μm and 1.55 μm are shown both in measured values and calculated values, noting the significance of these wavelengths in applications such as optical communications and optical measurement. The graph clearly shows that R is larger at 1.55 μm than at 1.3 μm.

Description will now be given to the second problem of the optical power measurement errors which depend on the incident light spectrum.

FIG. 8 shows the spectral responsivity of a GaInAs-/InP-PIN photodiode and errors made when the optical power meter is calibrated with the lights of the spectral widths W=10, 20 and 40 nm, respectively. FIG. 9 is a graph to show the dependence of the errors on the incident light spectrum at the wavelength of 1.55 μm.

Errors in optical power measurement occur, as indicated in Wendland et al (4), because the spectral responsivity is not flat. This is not limited to wavelengths in the vicinity of 1.55 μm, but also applicable to shorter wavelengths. Therefore, even if an optical power is calibrated at a specific wavelength by using a light source having the spectral responsivity fixed at a level, errors will occur depending on the spectral width of the light source when optical power is actually measured.

The present invention aims to solve the aforementioned problems encountered in the prior art and to provide a photodiode which has a spectral responsivity less dependent on the temperature at around 1.55 μm, and which is capable of optical power measurement less dependent on the incident light spectral width.

SUMMARY OF THE INVENTION

The photodiode according to the present invention is characterized in that it has a $Ga_xIn_{1-x}As$ light-absorbing layer wherein the composition of x is less than 0.47, and that it has a buffer layer between the light-absorbing layer and an InP substrate for decreasing the effect of lattice mismatch thereof.

The buffer layer includes a GaInAs layer made of materials substantially the same as those of the light absorbing layer and a strained multi-layer formed between the GaInAs layer and the light-absorbing layer. The strained multi-layer may comprise plural GaInAs layers with lattice mismatch against InP larger than the materials of the light-absorbing layer, and of alternately located GaInAs layers and InP layers.

The InP layer in the buffer layer may be replaced with GaInAs, or with GaInAs/GaInAs which is a combination of ternary semiconductor alloys having a lattice mismatch.

A cap layer mainly composed of InP and an electrode contacting the surface of the cap layer may be further provided on the incident side of the light-absorbing layer. It is desirable that at least the light receiving region of the cap layer be made thinner than the region on which the electrode is provided.

InP in the cap layer may be replaced by $Al_pIn_{1-p}As_qP_{1-q}$ of the compositions of p and q having substantially the same lattice constant as the light absorbing layer, especially with $Al_pIn_{1-p}As$ or $InAs_qP_{1-q}$. In this case, the cap layer or at least the region for receiving light thereon is desirably formed thinner than the region where the electrode is provided.

$Ga_xIn_{1-x}As$ having x which is less than 0.47 has an absorption-edge wavelength which is longer than that of $Ga_{0.47}In_{0.53}As$, and the spectral responsivity in the range of 1.5-1.6 μm becomes flat.

However, in the range where x<0.47, lattice matching with InP cannot be obtained. Therefore, a buffer layer such as a strained multi-layer is inserted between the InP substrate and the light-absorbing layer. This can decrease defects in the crystal within the light-absorbing layer to prevent deterioration in the spectral responsivity.

When a cap layer is formed, defects which will otherwise be caused by lattice mismatch with the light-absorbing layer may be prevented by forming the cap layer thinner. By forming the cap layer thinner to the extent that carrier surface recombination would not become large enough to decrease spectral responsivity, the light absorption on the side of shorter wavelength may be decreased as well as the deterioration of spectral responsivity can be prevented in the wavelength less than about 1 μm.

Even when the cap layer is made thin, however, the region where an electrode is formed should be formed thick. This can prevent the electrode metals from diffusing and affecting the junctions of the photodiode and secure reliability in electrode formation.

Lattice matching with the light-absorbing layer may be achieved by using $Al_pIn_{1-p}As$ or $InAs_qP_{1-q}$ as the material of the cap layer instead of InP. In this case, the cap layer may be formed thin, too.

BRIEF DESCRIPTION OF THE DRAWINGS

These and other aspects of the invention will now be described in detail with reference to the accompanying drawings, wherein.

DESCRIPTION OF THE PREFERRED EMBODIMENT

Figure 1:
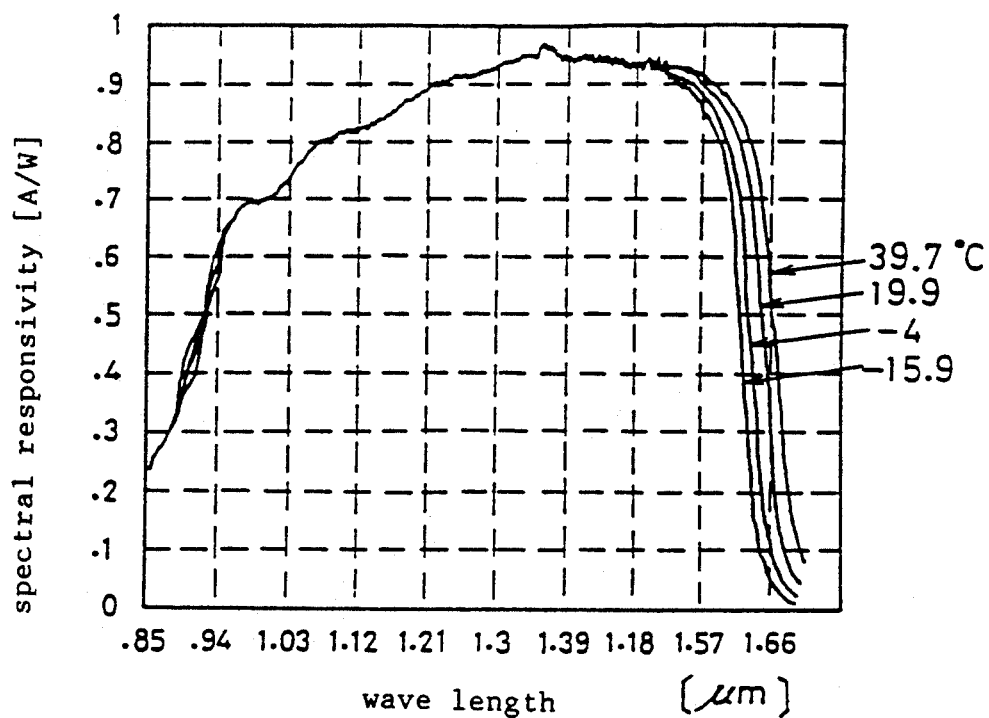
FIG. 1 is a view to show an example of spectral responsivity of a conventional photodiode.
Figure 2:
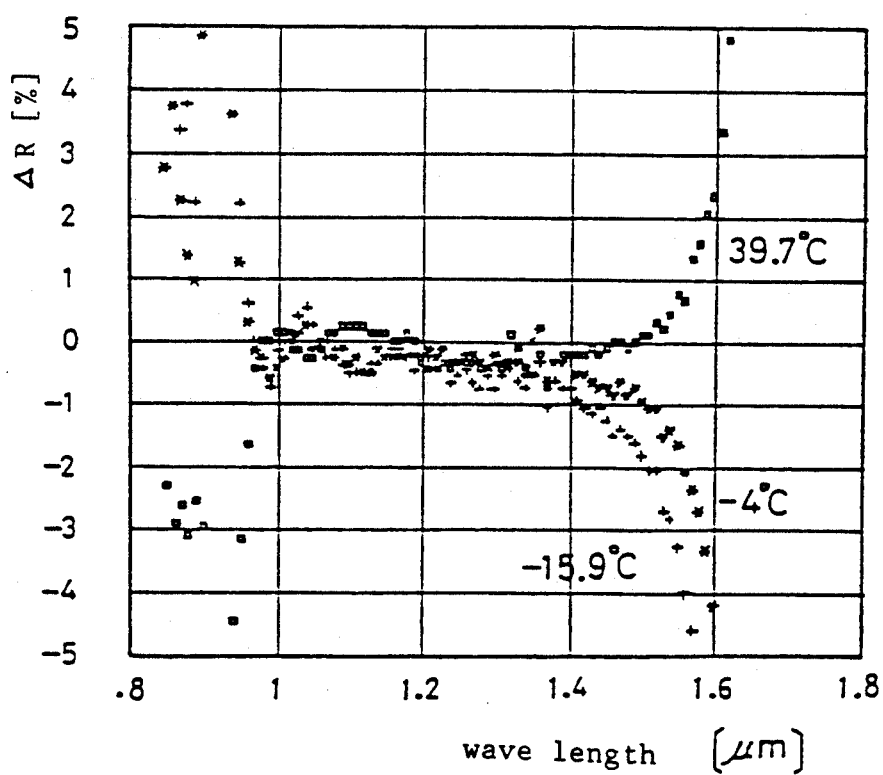
FIG. 2 is a view to show temperature dependent changes in spectral responsivity.
Figure 3:
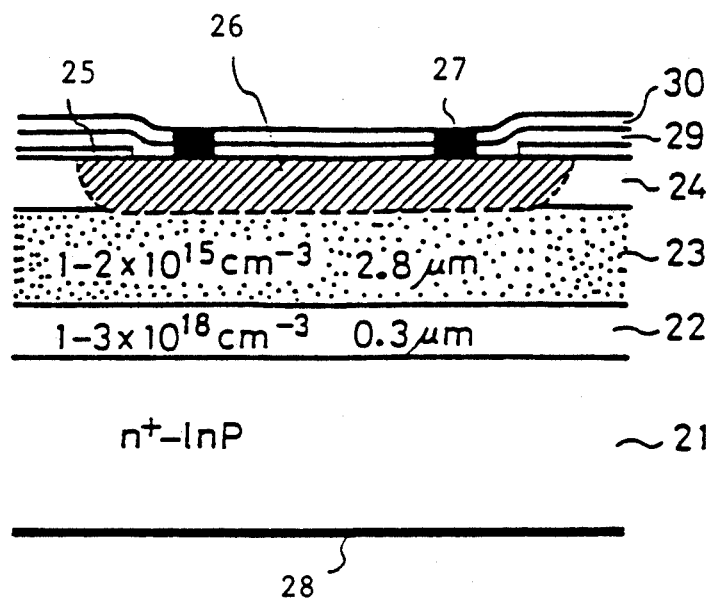
FIG. 3 is a view to show a device model for analysis.
Figure 4:
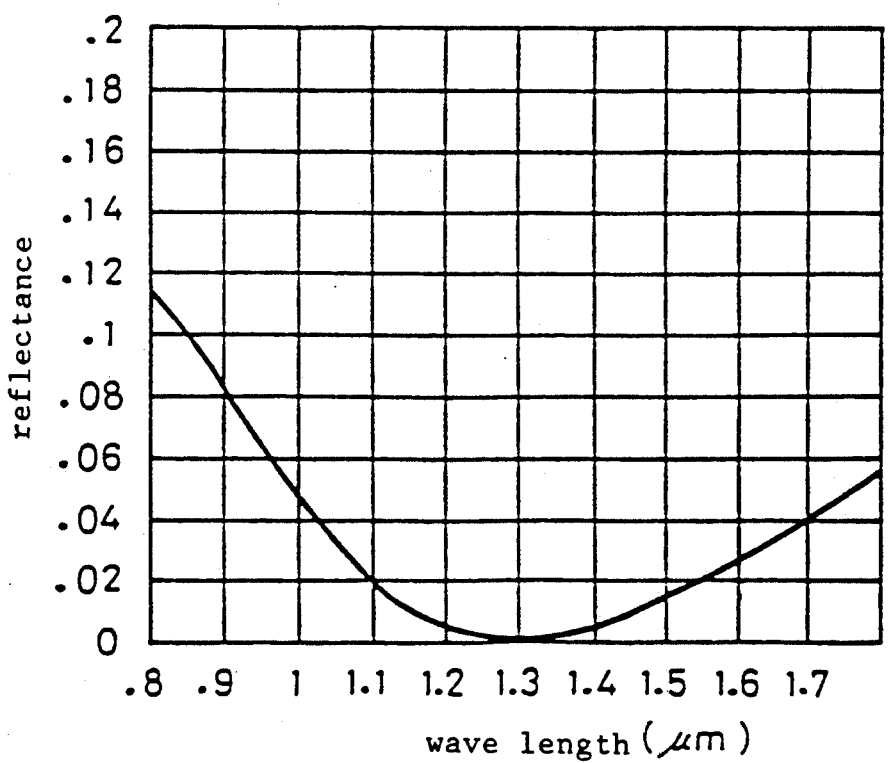
FIG. 4 is a view to show calculations of the reflectance of anti-reflection film.
Figure 5:
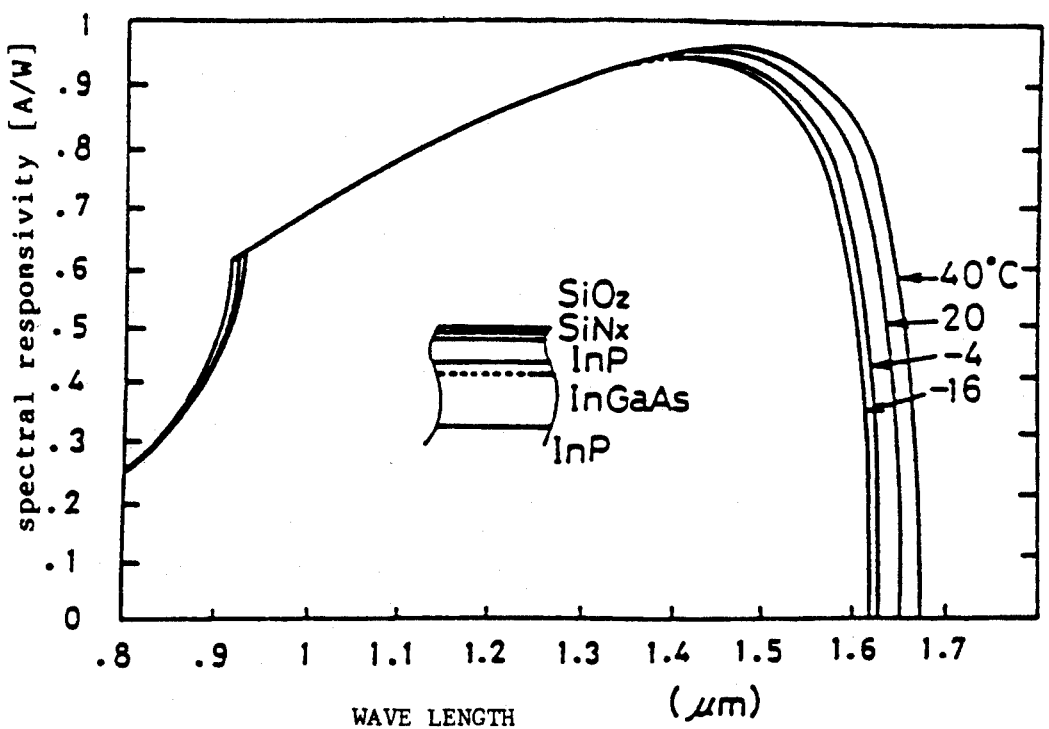
FIG. 5 is a graph to show calculations of spectral responsivity.
Figure 6:
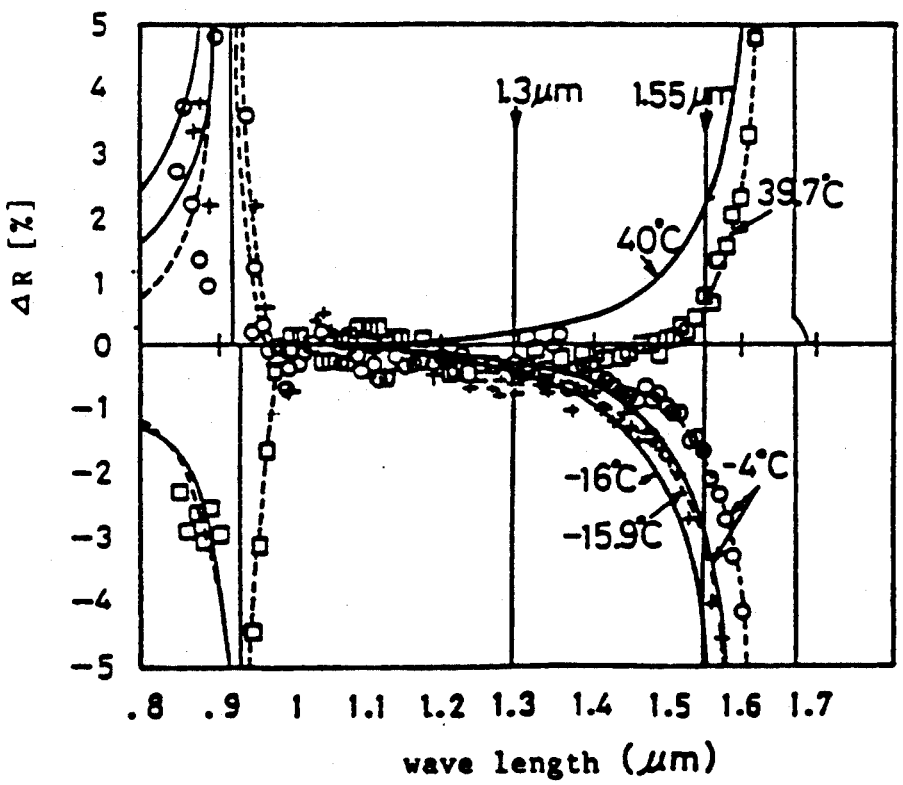
FIG. 6 is a graph to show temperature dependent changes in spectral responsivity both in calculated and measured values.
Figure 7:
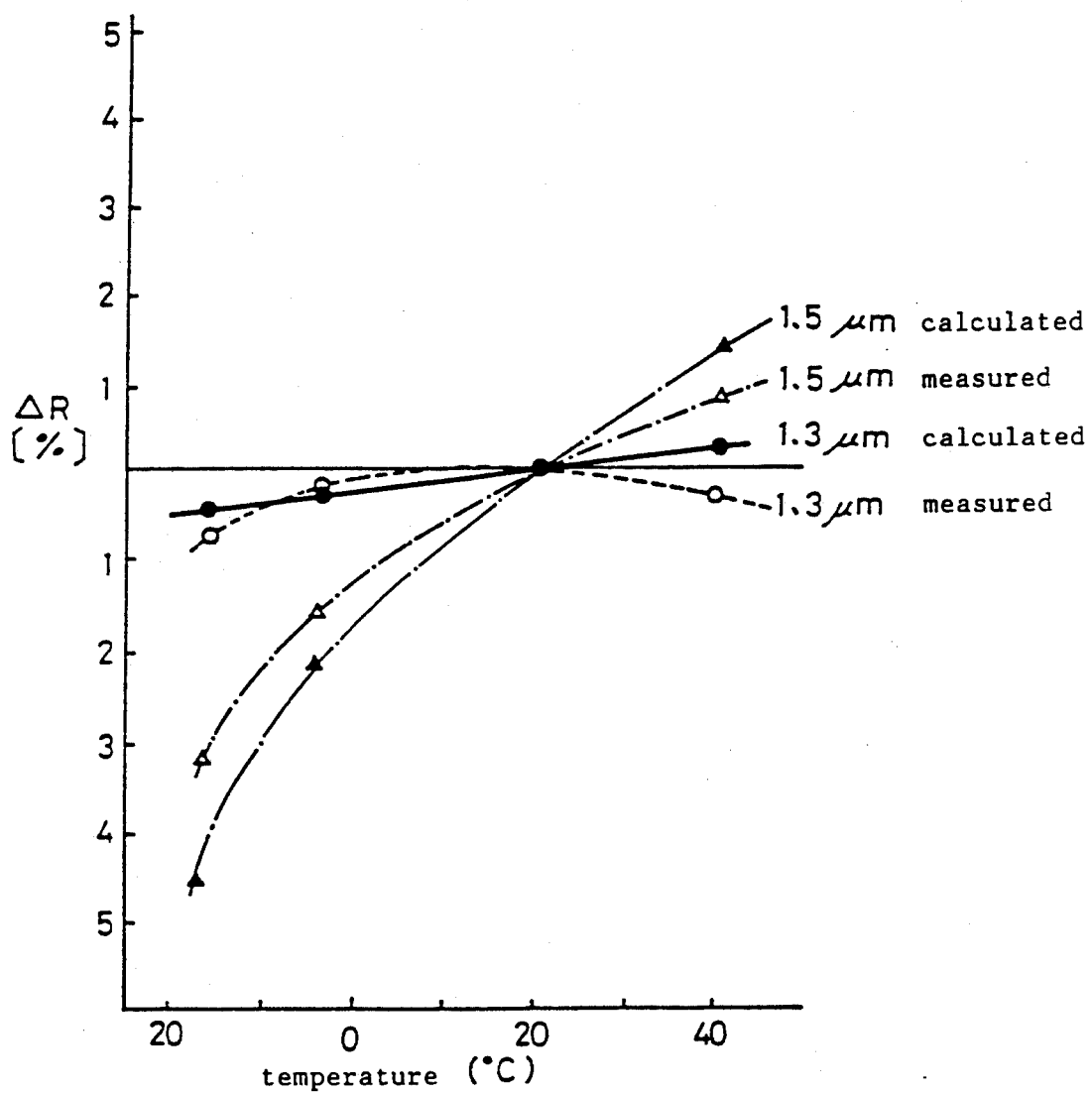
FIG. 7 is a graph to show changes in spectral responsivity at the wavelengths of 1.3 μm and 1.55 μm both in calculated and measured values.
Figure 8:
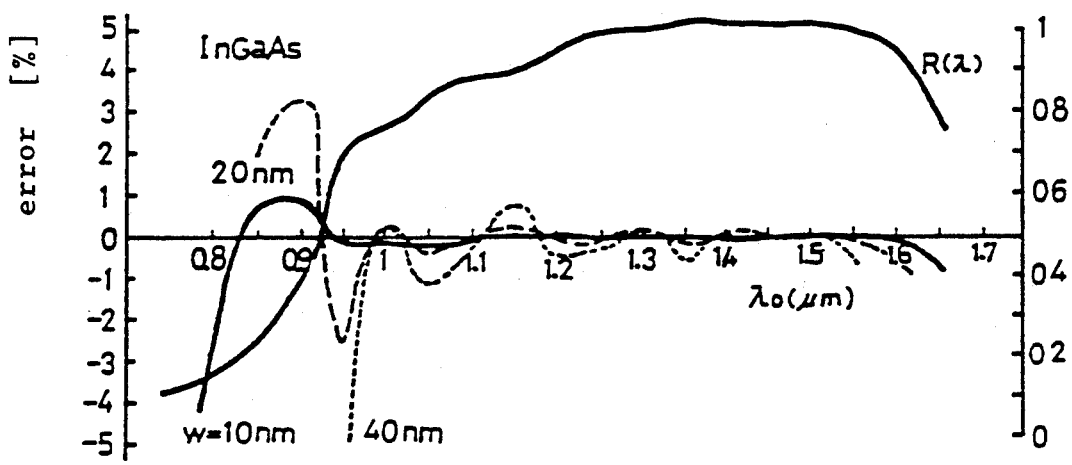
FIG. 8 is a graph to show the spectral responsivity of GaInAs/InP-PIN photodiode and the errors thereof.
Figure 9:
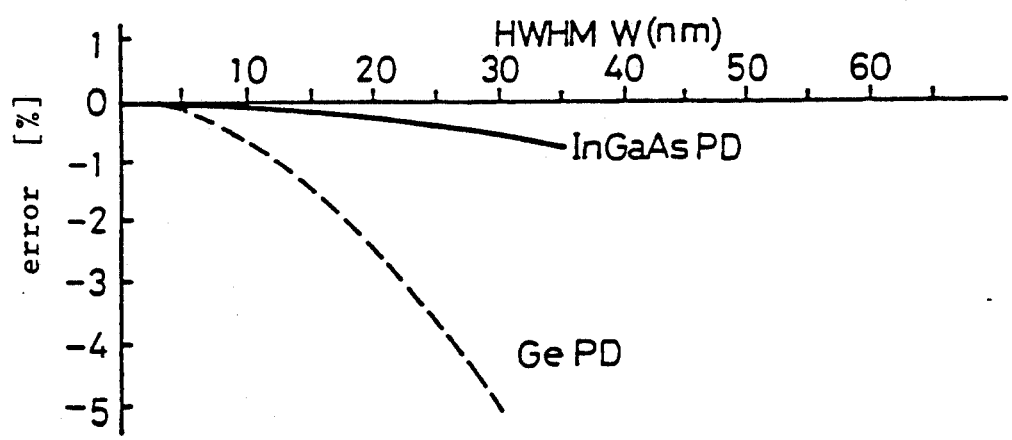
FIG. 9 is a graph to show the incident light dependence of errors at the wavelength of 1.55 μm.
Figure 10:
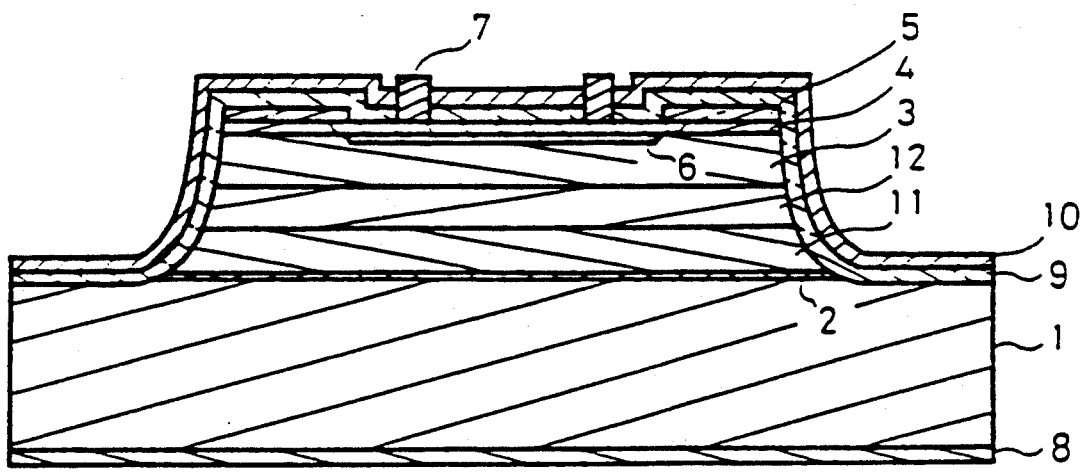
FIG. 10 is a section of an embodiment of the photodiode according to this invention.
Figure 11:
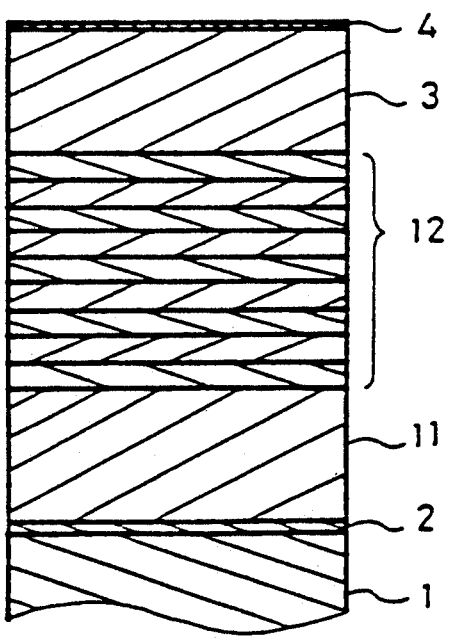
FIG. 11 is a partial enlarged view to show the embodiment of the photodiode.

FIG. 10 is a sectional view to show the structure of an embodiment of the photodiode according to this invention, and FIG. 11 a partial and enlarged section thereof. This embodiment is an application of this invention to a PIN photodiode.

This photodiode has a light-absorbing layer 3 which absorbs incident light and generates electric current carriers on an InP substrate 1. It is also provided with an InP cap layer 4 on the incident side of the layer 3, and the surface of the cap layer 4 is coated with an $SiN_x$ layer 5 around the light receiving region. A Zn-diffused region 6 is formed on the light-receiving region extending from the cap layer 4 toward the light-absorbing layer 3. An Au-Zn/Au electrode 7 is provided on the surface of the Zn diffused region 6, and an Au-Sn/Au electrode 8 is provided on the rear surface of the substrate 1. An $SiN_x$ film 9 and an $SiO_2$ film 10 are formed on the surface of the cap layer 4 including the Zn-diffused region 6 and the side surfaces of the device as anti-reflection film.

This embodiment of the invention is characterized in that the light-absorbing layer 3 is composed mainly of $Ga_xIn_{1-x}As$ with the composition x being less than 0.47, and a GaInAs layer 11 and a strained multi-layer 12 are provided between the light-absorbing layer 3 and the substrate 1 as a buffer layer which decreases any lattice mismatch effect therebetween.

The manufacturing method of this device will now be described. All the epitaxial layers of InP and GaInAs are grown by MOVPE (metal organic vapor phase epitaxy).

The substrate 1 used is an n+ type InP crystal doped with S, on which is grown S-doped n+ type InP for 50-70 nm at 400° C. to be used as a buffer layer 2.

Then, an S-doped n+ type GaInAs having 0.5% lattice mismatch (a/a) as against InP is grown for 1.3 μm thickness as a GaInAs layer 11. The growth is temporarily suspended here. The temperature is repeatedly changed between 700° C. and 200° C. for several cycles to decrease crystal defects and internal strain within the layer 12. Then, a plurality of S-doped n+ type GaInAs layers having 0.9% lattice mismatch and S-doped n+ type InP layers are alternately grown to be used as a strained multi-layer 12.

A GaInAs layer having a lattice mismatch of 0.5% carrier concentration of $1-3 \times 10^{115}$ cm$^{-3}$ is epitaxially grown for about 1.3 μm thickness to be used as the light-absorbing layer 3. Moreover, an n type InP layer is thinly (e.g. 20 nm thick) grown to be used as the cap layer 4. The structure obtained by these steps is shown in FIG. 11.

Then, using an $SiN_x$ film 5 as a mask, Zn is diffused to be used as the p+ type Zn-diffused region 6. This forms a p+-n− junction within the light-absorbing layer 3.

An $SiN_x$ film 9 and an $SiO_2$ film 10 are formed on the light-receiving region as anti-reflection film, and ohmic electrodes 7, 8 are respectively formed on the surface and the reverse surface of the Zn-diffused region 6.

Figure 12:
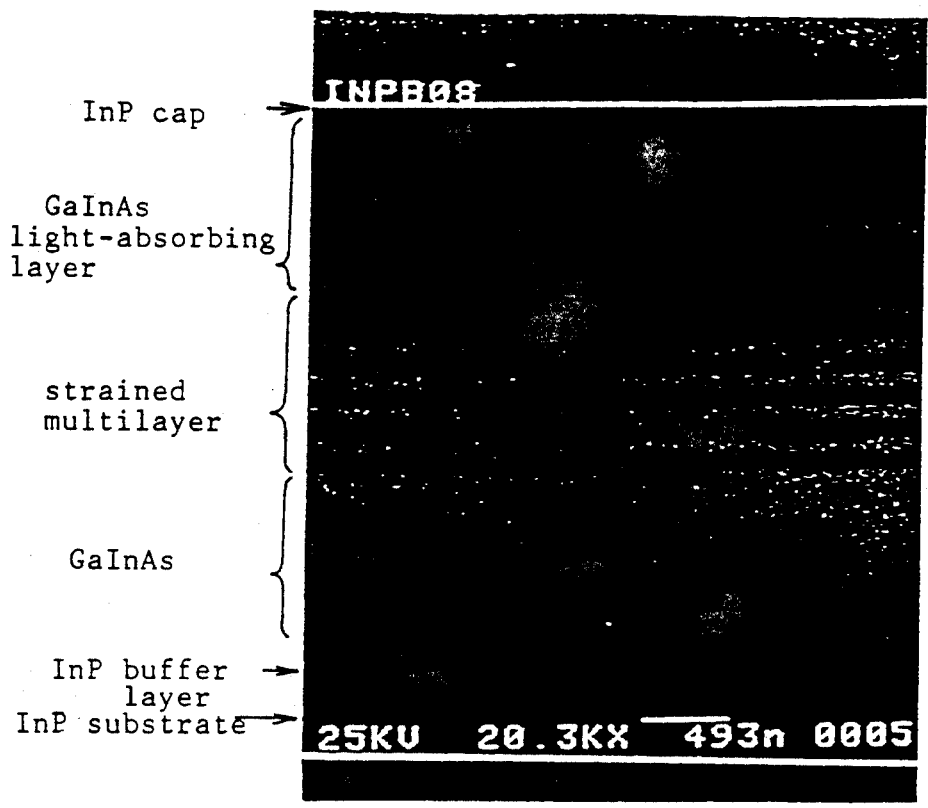
FIG. 12 is an SEM (secondary electron microscope) image of a structure where a buffer layer, a GaInAs layer, a strained multi-layer, a light-absorbing layer and a cap layer are epitaxially grown on a substrate.
Figure 13:
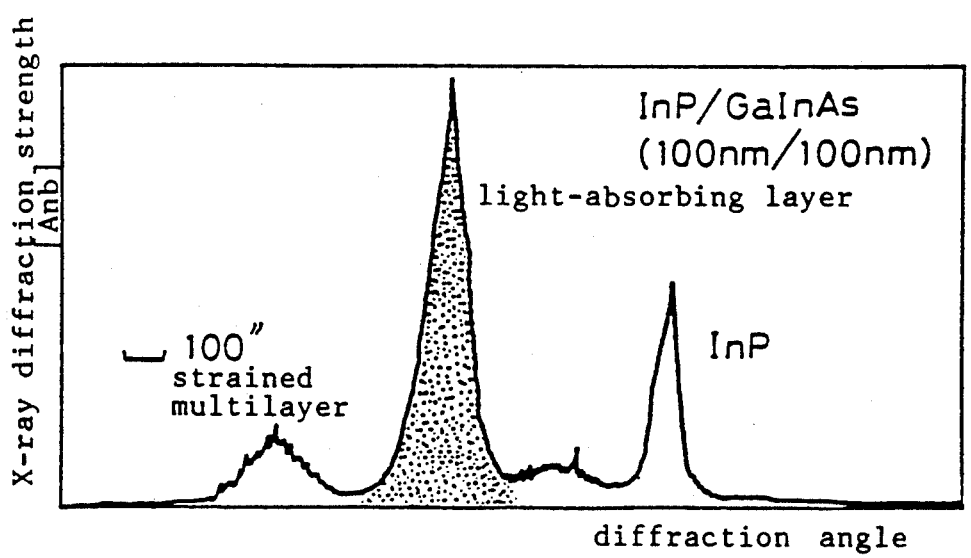
FIG. 13 is a graph to show the result of X-ray diffraction measurement on the structure.

FIG. 12 is an SEM image which shows a section of the structure epitaxially grown with the buffer layer 2, GaInAs layer 11, strained multi-layer 12, light-absorbing layer 3 and cap layer 4 on the substrate 1. FIG. 13 shows the result of X-ray diffraction measurement of the same structure. Referring now to FIG. 13, it is understood that the peak (full width half maximum approximately 100 sec) of GaInAs by the light-absorbing layer 3 is separated from the peak of InP by the substrate 1, the lattice mismatch becomes about 0.5%, and that the composition $x < 0.47$.

Figure 14:
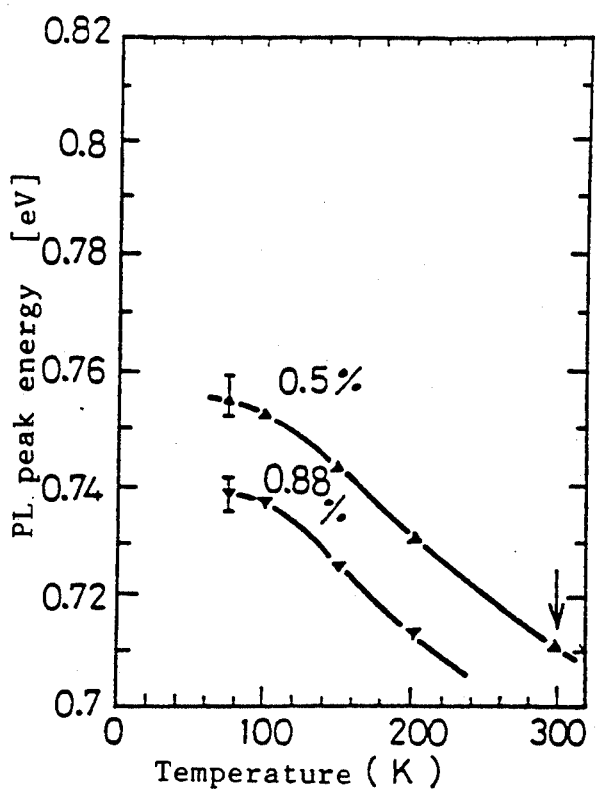
FIG. 14 is a graph to show temperature dependence of photoluminescence peak energy.

FIG. 14 shows temperature dependence of photoluminescence peak energy respectively for the GaInAs with a lattice mismatch of 0.5% and of the strained multi-layer with a lattice mismatch of 0.88%. The peak energy substantially coincides with the band gap energy. Photoluminescence peak energy of this GaInAs at room temperature (300 K.) is 0.71 eV, and the absorption-edge wavelength corresponding thereto is 1.75 μm. Therefore, the spectral responsivity can be extended to be a longer wavelength.

Figure 15:
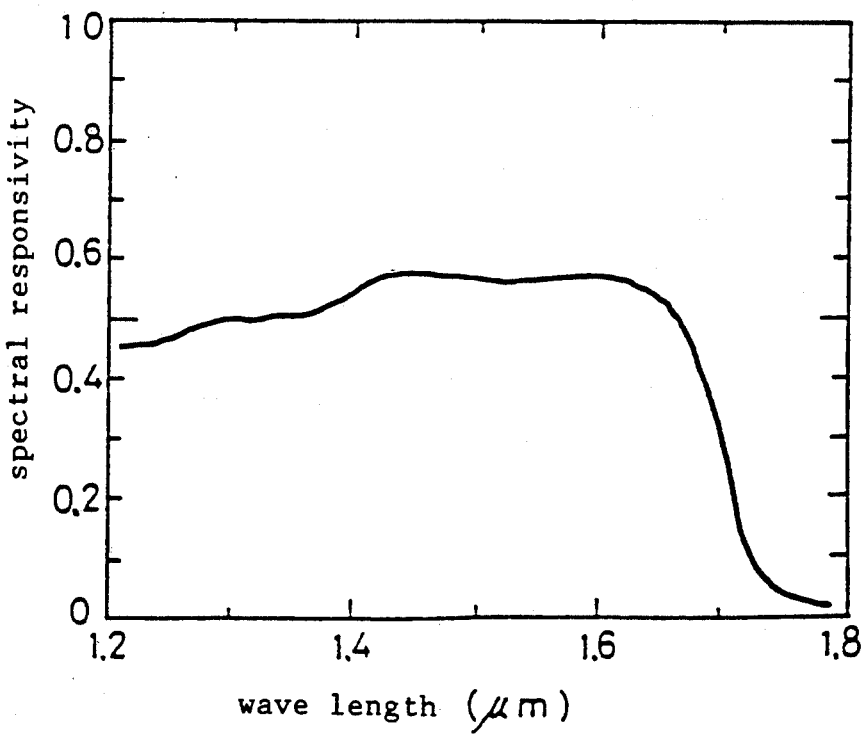
FIG. 15 is a graph to show the spectral responsivity of a trial photodiode.

FIG. 15 shows the result of measurement of the spectral responsivity of a trial photodiode having the aforementioned structure at 20° C. The absorption edge of the light-absorbing layer 3 was extended to be a longer wavelength, and flat responsivity was obtained at wavelengths between 1.5–1.65 μm.

As the thickness of the light-absorbing layer 3 was set for about 1 μm in this embodiment, the spectral responsivity remained 50–60 [A/W] (external quantum efficiency of about 50%), but if the thickness of the layer 3 is set at 2 μm or higher, the spectral responsivity could be 0.8[A/W] or higher. When the spectral responsivity was measured at 20° C. and 0° C., temperature dependency of the spectral responsivity at the wavelength of 1.55 μm was larger by only 0.2–0.3% than that at 1.3 μm.

Therefore, by extending the absorption-edge wavelength of GaInAs to a longer wavelength as in this case, a photodiode having flat spectral responsivity at the range near 1.5 μm can be realized. This minimizes temperature dependence of the spectral responsivity in the range, and reduces measured calibration errors when the incident light spectral width is large, which otherwise causes a critical problem in optical power measurement.

By forming the cap layer 4 thinner, not only defects which would otherwise be caused by lattice mismatch can be prevented but also the spectral responsivity at shorter wavelengths can be enhanced to achieve flat spectral responsivity characteristics.

Figure 16:
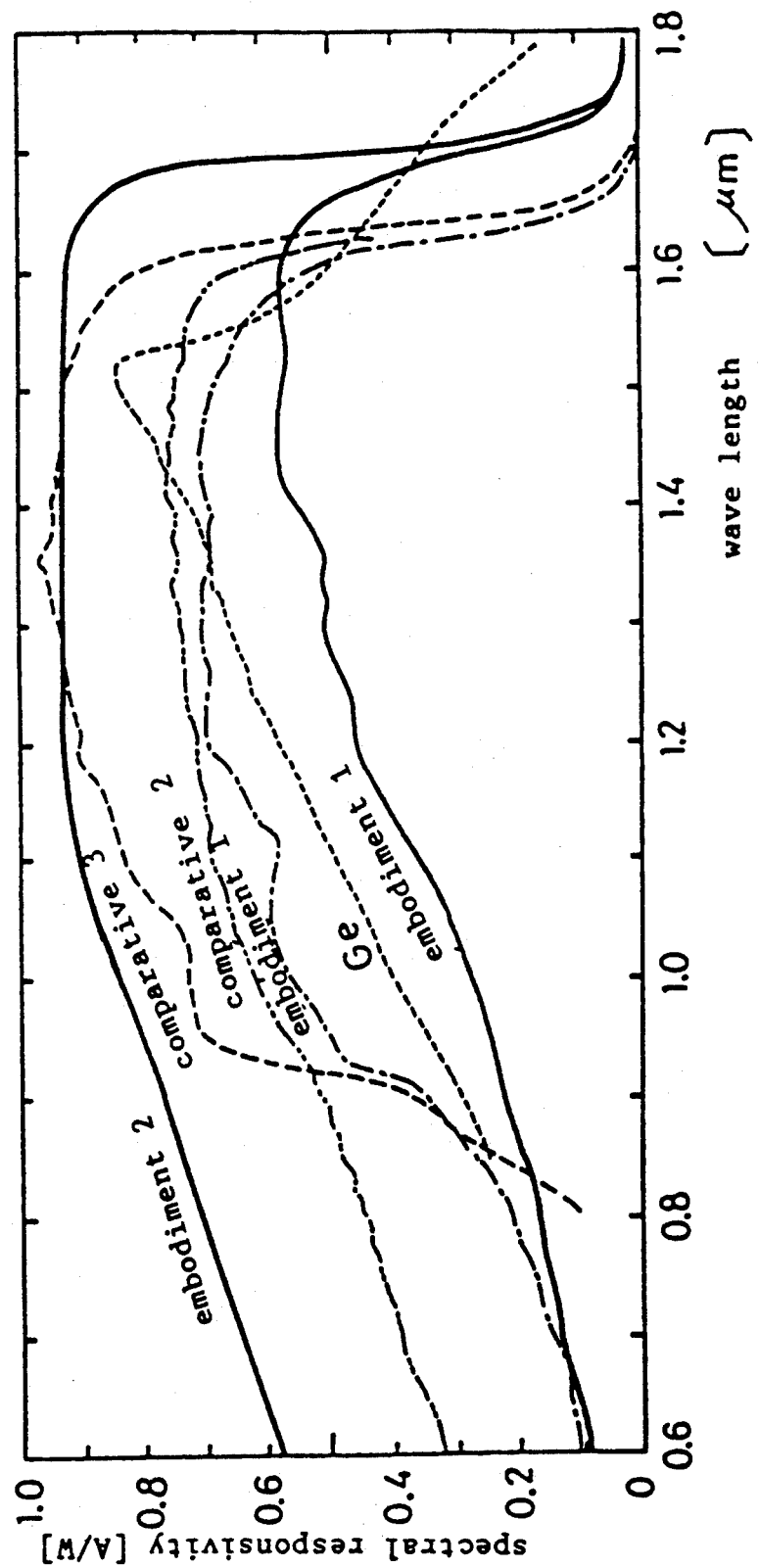
FIG. 16 is a graph to show spectral responsivity of various photodiodes.

FIG. 16 shows a spectral responsivity of various devices.

Example 1

The sample is a trial photodiode made in accordance with the above embodiment and has an approximately 1 μm thick light-absorbing layer, and a 0.02 μm thick InP cap layer.

Example 2

The sample is similar to the above Example 1 but has a thickness of 2 μm in the light-absorbing layer. These are calculated values.

Comparative Example 1

The sample is a photodiode having the conventional structure with the thickness of 1.4 μm in the light-absorbing layer and 0.07 μm in the InP cap layer.

Comparative Example 2

The sample has the structure substantially similar to Comparative Example 1; the thickness of the light-absorbing layer is about 1.4 μm but the thickness of the InP cap layer is 0.07 μm.

Comparative Example 3

The sample is a commercial GaInAs-PIN photodiode. The thickness of the light-absorbing layer is 2 μm or more.

Ge: A commercial Ge-PIN photodiode

Except for Example 2, all the values are measured values. In Example 1, the spectral responsivity is generally low as the light-absorbing layer is made thin, but at longer wavelengths its responsivity is higher than conventional devices except for Ge and has flat characteristics. It does not show a drop in responsivity at shorter wavelengths as seen in the commercial device of Comparative Example 3, and has flat characteristics. This is attributable to the fact that the thickness of InP cap layer is reduced. The difference achieved is further shown when compared with Comparative Examples 1 and 2.

The difference between Comparative Examples 1 and 2 is only the thickness of the InP cap layer. With only such a trivial difference, the spectral responsivity at shorter wavelengths is enhanced, the effect of multiple reflection within the InP cap layer is reduced and the spectral responsivity is made flatter.

Although the above statements refer to cases where the material for the cap layer is InP, other materials that can achieve lattice match with $Ga_xIn_{1-x}As$ of the light-absorbing layer may be used, for example, AlInAsP.

Figure 17:
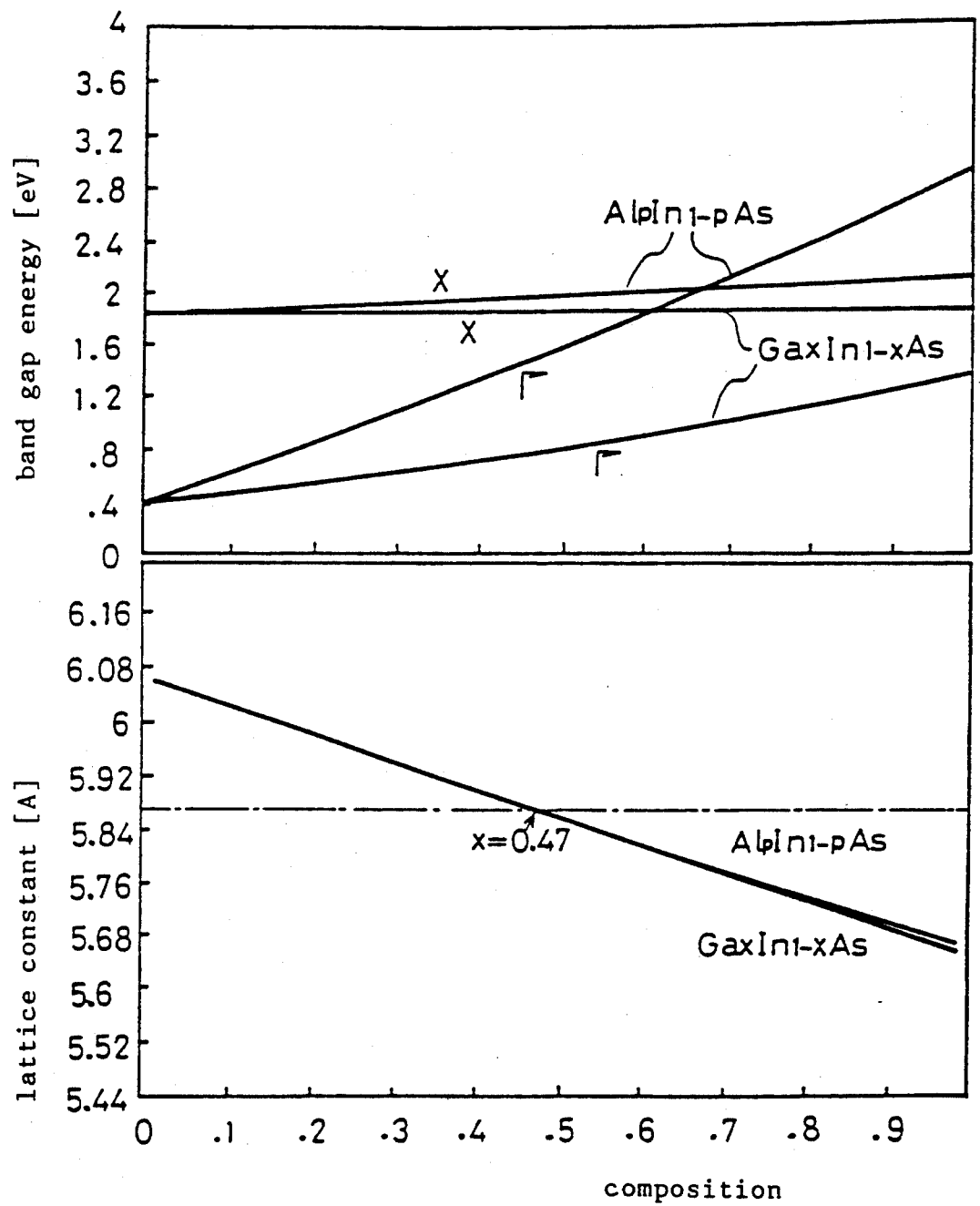
FIG. 17 is a graph to show changes in band gap energy and in lattice constant of $Ga_xIn_{1-x}As$ and of $Al_pIn_{1-p}As$.

FIG. 17 shows changes in the band gap energy and lattice constant in $Ga_xIn_{1-x}As$ and $Al_pIn_{1-p}As$ of respective compositions.

When the absorption-edge wavelength of $Ga_xIn_{1-x}As$ comprising the light-absorbing layer is extended to the longer wavelengths, a lattice match therebetween can be obtained by changing the composition p of $Al_pIn_{1-p}As$ corresponding to the changes in lattice constant. In order to make the cap layer transparent against the incident light, the band gap energy of $Al_pIn_{1-p}As$ is selected to be larger than the band gap energy of $Ga_xIn_{1-x}As$.

Figure 18:
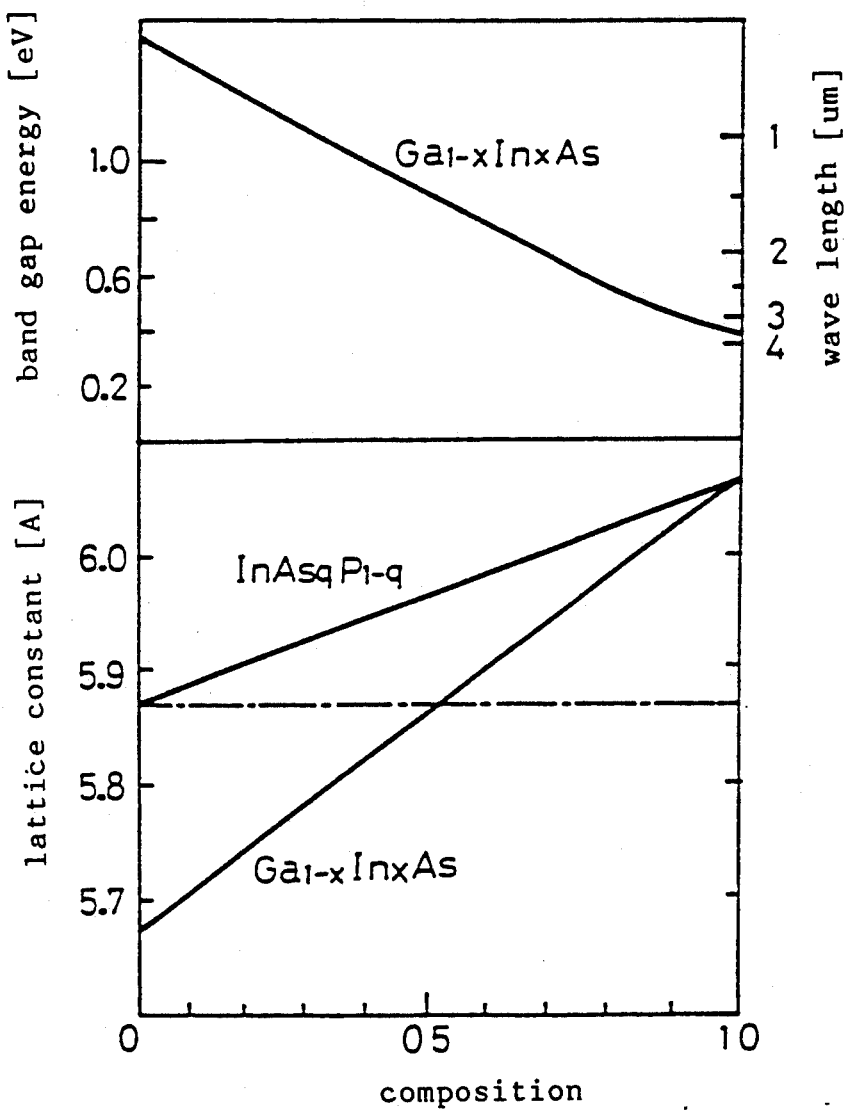
FIG. 18 is a graph to show changes in band gap energy and in lattice constant of $Ga_xIn_{1-x}As$ and of $InAs_qP_{1-q}$.

FIG. 18 shows the band gap energy and lattice constant of $Ga_xIn_{1-x}As$ and of $InAs_qP_{1-q}$ at respective compositions. However, in this figure, the axis of the composition against GaInAs is reversed from that in FIG. 17.

In this case, when the absorption edge of $Ga_xIn_{1-x}As$ constituting the light-absorbing layer is extended to longer wavelengths, a lattice match would be achieved if the composition q of $InAs_qP_{1-q}$ is modified corresponding to the changes in the lattice constant.

When materials other than InP are used for the cap layer, the light-receiving region should be made thinner than the region where the electrode is formed. This makes the spectral responsivity flatter, improves the spectral responsivity at shorter wavelengths (or the wavelength range where the cap layer absorbs light), and minimizes the effect of diffusion of electrode metal to the junctions of the photodiode to enhance the reliability of electrode formation.

As described in the foregoing, the photodiode according to this invention is fabricated by changing the composition of the GaInAs light-absorbing layer in a manner to make the absorption edge extend toward longer wavelengths, and reducing the defects caused by entailed lattice mismatch with InP by means of a buffer layer. This can realize the spectral responsivity at the longer wavelengths which could not heretofore be obtained by the conventional photodiode using GaInAs which is lattice matched with InP, and can realize a flat spectral responsivity characteristics in the wavelength range close to 1.5 μm.

Errors which might be caused by the effect of temperature at the time of measurement of optical power or the effect of spectral width of the incident light can be remarkably reduced by eliminating irregularities in spectral responsivity (quantum efficiency).

The light around the wavelength of 1.55 μm is the band of emission wavelength for GaInAsP lasers which is the wavelength used for optical communications and optical measurement devices which mainly measure the optical power. Therefore, the photodiode of this invention photodiode is highly practical as it can measure such a wavelength range with smaller errors.

Further, if the light receiving region of the cap layer is reduced in thickness compared to the region where electrode is formed, the spectral responsivity at shorter wavelengths can be improved without damaging the reliability of electrode formation. This can realize photodiodes having high spectral responsivity and bandwidths of unprecedentedly wide wavelengths.

What is claimed is:

1. A photodiode comprising:

an InP substrate;

a light-absorbing layer which is provided on said InP substrate and absorbs incident light to generate carriers, said light-absorbing layer being formed mainly of $Ga_xIn_{1-x}As$ wherein the composition x is less than 0.47;

a buffer layer provided between said light-absorbing layer and said substrate, formed of a material to decrease a lattice mismatch effect between said light absorbing layer and said substrate; and a cap layer provided on an incident side of the light-absorbing layer, which has a lattice constant substantially the same as that of the light-absorbing layer and which is mainly composed of $Al_pIn_{1-p}As_qP_{1-q}$ of compositions p and q.

2. The photodiode as claimed in claim 1 further comprising an electrode contacting with the surface of the cap layer, wherein at least one of the cap layer and the light-receiving region thereof is thinner than a region where said electrode is provided.

* * * * *